Figure 1:
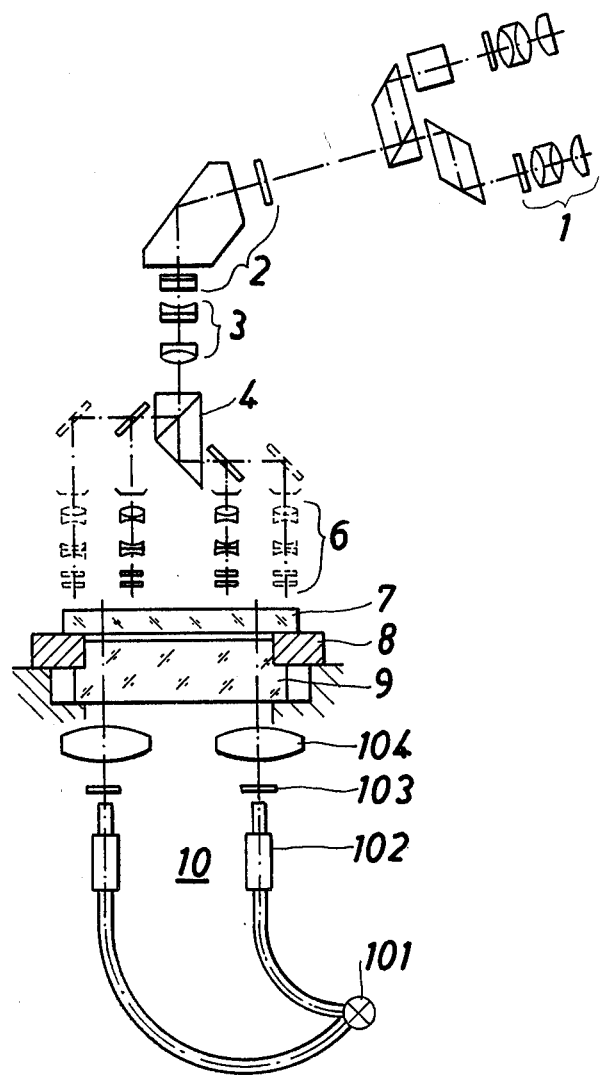

United States Patent [19]

Gommel et al.

[11] 4,126,376
[45] Nov. 21, 1978

[54] MANIPULATION DEVICE FOR PRECISION ADJUSTMENTS INCLUDING A DOUBLE MICROSCOPE HAVING ADJUSTABLE OPTICAL AXES

[75] Inventors: Karl-Werner Gommel; Uwe Michl; Hans Radtke, all of Jena, German Democratic Rep.

[73] Assignee: Jenoptik Jena G.m.b.H, Jena, German Democratic Rep.

[21] Appl. No.: 768,669

[22] Filed: Feb. 24, 1977

[51] Int. Cl.² .............................................. G02B 21/32
[52] U.S. Cl. ...................................... 350/90; 356/399
[58] Field of Search ............................ 350/90, 86, 81; 356/138, 172

[56] References Cited

U.S. PATENT DOCUMENTS

| | | | |
|---|---|---|---|
| 3,288,045 | 11/1966 | Harding | 350/90 |
| 3,600,811 | 8/1971 | Weyrauch | 350/86 |
| 3,628,717 | 12/1971 | Lynch et al. | 350/81 |
| 3,720,849 | 3/1973 | Bardolz | 350/86 |
| 3,870,416 | 3/1975 | Brady et al. | 350/90 |

*Primary Examiner*—Jon W. Henry

[57] ABSTRACT

The invention relates to a manipulation device for precision adjustment of plane pattern bearing substrates being provided with two adjustment marks which are at different distances relative to a reference mark, which is, for example, a graduation plate. Such a substrate can be, for example, an intermediate negative or the like which is required in the course of a photolithographic mask production of integrated circuits. The manipulation device is constructed in such a manner that the pattern bearing substrate is substantially aligned relative to a reference mark by two orthogonal displacements and one rotation. This is accomplished by three displacement members which act upon a slide. Said slide, upon which the pattern bearing substrate is disposed, permits displacements parallel to the plane of the latter. Said displacement members are so arranged that the vectors of the orthogonal displacement actions pass one of the two adjustment marks.

Therefore, one of the two displacement members is, according to the distance between the adjustment marks on the pattern bearing substrate, seated for definite displacement steps, at right angles to the displacement direction of the substrate.

1 Claim, 6 Drawing Figures

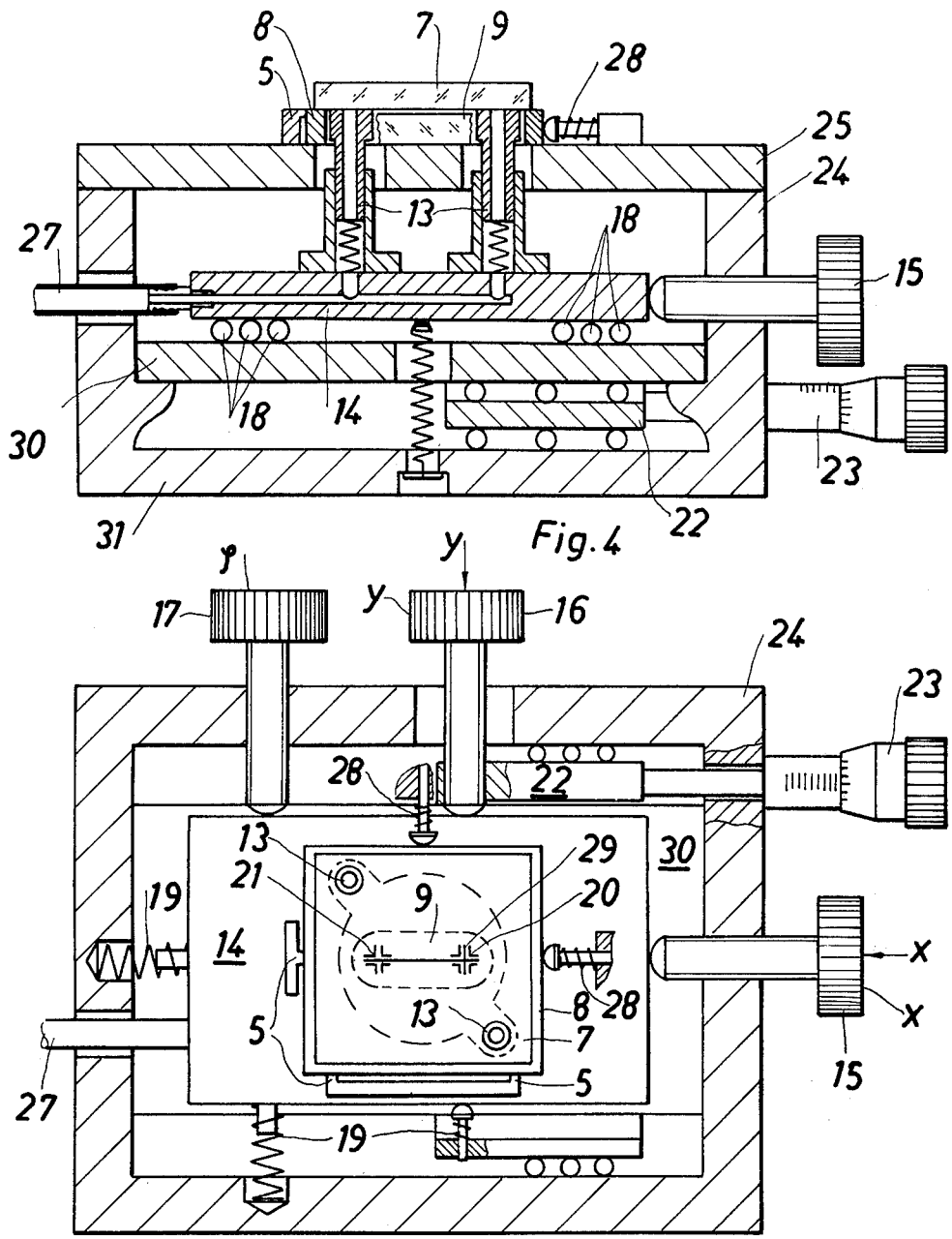
Fig. 4
Fig. 5
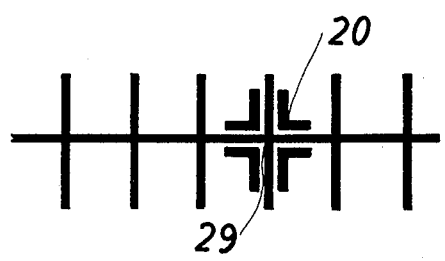
Fig. 6

MANIPULATION DEVICE FOR PRECISION ADJUSTMENTS INCLUDING A DOUBLE MICROSCOPE HAVING ADJUSTABLE OPTICAL AXES

This invention is in concern of a manipulation device for precision adjustment of pattern bearing substrates. Said substrates are provided with two adjustment marks at different distances relative to a non-displaceable reference mark.

The adjustment operation which is observed through a double microscope involves displacements of said substrates in $x$- and $y$-direction and rotations in the $xy$-plane and is observed through a double microscope having adjustable optical axes.

In the course of the production of semiconductor circuits the photolithographic process very often requires the alignment of a structured mask with reference markings which necessitates motions angularly and/or along two Cartesian coordinates.

In this event the mask is provided with the adjustment marks which are observed through a double microscope or scanned by light-electrical means when the adjustment marks are brought into coincidence with the reference marks on a reference structure.

Further, it is necessary to align an intermediate negative with reference marks provided on respective means in a step-and-repeat camera in the course of a mask production.

Furthermore, when the microstructures of a mask have to be transfered to a semiconductor substrate, an accurate regristration with the structures of the previous processing operation has to be obtained, that is, the adjustment marks on the mask have to be aligned with those on the semiconductor substrate discs.

Since the individual substrate discs are of different diameters and since the adjustment marks are preferably arranged on the rim-portions of the substrate discs, the adjustment marks on, the substrate discs and on the masks are at different spaces. There is already known a double microscope with a manipulation device which is used to align an intermediate negative relative to a frame, the latter being used as a support to be inserted in a step-and-repeat camera, (refer to Fedotow/Pohl "Fotolithografie", Verlag Technik, Berlin 1974).

In this device the reference mark is embodied by a graduated plate, upon which the division lines are arranged in the $x$- and $y$-coordinate directions.

Said graduated plate is in cooperation with three adjustment stops and is non-displaceably mounted in the double microscope.

The microscope stops which serve to hold the supporting frame are associated to stops provided in the step-and-repeat camera.

The two marks on the intermediate negative and the reference mark on the graduated plate are aligned relative to each other by displacement of the intermediate negative relative to the frame.

In the course of this adjustment operation the marks involved are alternatingly or simultaneously observed in a double microscope which is provided with a split observation field. The displacement of the intermediate negative in $x$-direction and $y$-direction is accomplished by means of a cross-slide upon which a further table is mounted which permits a rotational displacement in order to cope with to cope with angular alignments.

Due to the fact that the individual adjustment coordinates are in a mutual dependence this known device involves the disadvantage that only after a large number of time consuming and cumbersome approximating adjustment steps, including an alternating adjustment of the marks, an accurate adjustment is attainable.

A mutual independence of the individual adjustment steps would have been obtained if, for example, the axis of rotation passed through one of the two marks.

In a first and a second step the one mark is adjusted in $x$-direction and in $y$-direction and, in a subsequent third step, the other mark is angularly adjusted without interfering with the adjustment state previously attained.

However, an adjustment principle which is based upon a device comprising a cross-slide and a rotational table cannot be employed when the individual adjustment marks on the intermediate negative are spaced differently from each other. A feasible solution of such a device requires a very complicated and therefore expensive combination of a cross-slide and a rotational table.

It is further known to effect a precision adjustment of a body in a plane by means of three adjustment members one of which being operative in a first direction, and the other two, parallel to one another, in the other displacement direction which is at right angles to said first. In this manner the body is adjusted or rotated in the plane.

This arrangement ensures the required independence of stepwise adjustments only when the adjustment marks have a definite position, otherwise numerous adjustment steps are again necessary to obtain a precision adjustment. It is an object of the present invention to obviate the above disadvantages.

It is a further object of the present invention to provide a manipulation device which considerably reduces the otherwise required time consuming adjustment operations of plane pattern bearing substrates intermediate negatives, masks or any other suitable objects used in semiconductor production.

It is still a further object of the present invention to provide a manipulation device which substantially reduces the adjustment of a pattern bearing substrate to two displacements at right angles to each other and to one rotational displacement.

These and other objects are realised by a manipulation device for high precision adjustments of a pattern bearing substrate including, in the $x$-direction of an $x$, $y$-coordinate system, two adjustment marks which are differently spaced from one another according to the size of the pattern field on the individual pattern bearing substrates and relative to a non-displaceable reference mark.

The pattern bearing substrate and hence said two adjustment marks are displaceable in two directions ($x$ and $y$ direction) at right angles to each other, and permit rotations in the plane defined by the $x$, $y$-coordinates.

The displacement operations are observed through a double microscope, the optical axes of which are adjustable.

The manipulation device comprises a housing on the top face of which the substrates are mounted for for displacements in parallel to the substrate plane.

A first displacement member displaces said pattern bearing substrate in the first ($x$-direction) of said two displacement directions, a second in the second direction ($y$-direction) and a third displacement member, which is arranged and effective in parallel either to the first or to the second displacement member permits an angular displacement.

The vectors of displacements of the first and the second member and the optical axes of the double microscope which are at right angles to the plane of the substrate have a common point of intersection.

The second displacement member (y-direction) is seated for displacement perpendicularly to its displacement direction to realize the common point of intersection even when the adjustment marks are before the fullstop.

Figure 2:
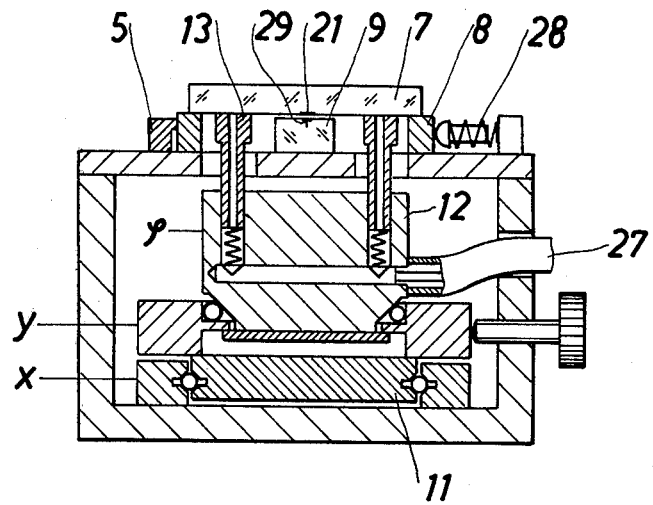
Figure 3:
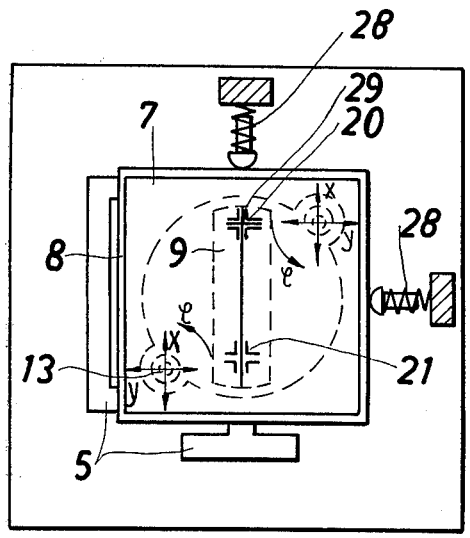

In order that the invention may be more readily understood, reference is made to the accompanying drawings which illustrate diagrammatically and by way of example one embodiment thereof and in which:

FIG. 1 is a schematical view of a double microscope of the prior art as employed for an initial orientation of an intermediate negative, FIG. 2 is a sectional view of a prior art manipulation device, FIG. 3 a top view of the device of FIG. 2, FIG. 4 a sectional view of a manipulation device according to the invention, FIG. 5 a top view of the device of FIG. 4, and FIG. 6 an enlarged view of an adjustment mark aligned relative to a reference mark.

In FIG. 1 the principle is illustrated in which a double microscope is used to pre-adjust an intermediate negative as required in step-and-repeat cameras.

An optical system 1, 2, 3 is employed to observe the images of marks 20, 21 (FIG. 3) located on the intermediate negative 7 and a reference mark 29 of a graduated plate 9, respectively. Said negative represents, for example, a transparent microcircuit bearing substrate.

The images are directed by objectives 6 to a prism 4 where the images are fused.

The marks on the negative 7 are adjusted by displacing the negative 7 relative to a frame 8 until the reference mark 29 (FIG. 2) of the non-displaceable graduated plate 9 coincides with the marks 20, 21 (FIG. 2) on the negative 7.

The stops 5 against which the frame 8 is pressed before receiving the negative 7, are adjusted relative to the non-displaceable reference mark 29 of the graduated plate 9 (FIGS. 2 and 3) and relative to the stops in a step-and-repeat camera (not shown).

The objectives 6 are alternatingly illuminated by an illumination system 10 constituted of a light source 101, a light cable 102, an aperture 103 and a condenser 104. The distances between the two microscope objectives have to be adjusted according to the different distances between the marks on the individual intermediate negatives.

The negative 7 is displaced by means of the manipulation device as shown in FIGS. 2 and 3.

A cross-slide 11 which serves to adjust the intermediate negative 7 in x- and y-direction supports a table 12 which permits rotational displacements and hence an angular adjustment of the negative 7, which in turn is tightly held by a suction means 13 to the table 12. The suction means 13 is operated via a vacuum connection pipe 27. The disadvantages of such an arrangement are described hereinabove in connection with the prior art devices. In the drawings 4 and 5 the inventional manipulation device for adjusting intermediate negatives 7 in $x$, $y$ and $\phi$ directions is illustrated.

This inventional device, in analogy to the device of FIG. 1, includes a double microscope and comprises a housing 24, with a top plate 25 having a plane surface for supporting the negative 7. As described hereinbefore the negative 7 is mounted on a frame 8 which is forced against stops 5 by spring means 28. The top plate 25 supports, in directional relation to stops 5 a graduation plate 9 with the reference marks 29.

A first slide 14 mounted on an intermediate plate 30 is displaced on, for example, balls 18 and forced by spring means 19 (or any other suitable means) to abut against three adjustment members 15, 16 and 17. The adjustment members 15 and 16 are arranged in a manner that their vectors of displacement intersect with the optical axis of the observation microscope which axis substantially passes through the adjustment mark 20. These two adjustment members serve to adjust the mark 20 in x-and y-direction.

A subsequent movement of a third adjustment member 17 rotates the negative 7 about the point which has been attained by the previous adjustment operation, that is, substantially about the already adjusted mark 20.

In this manner the angular adjustment of the second mark 21 is accomplished.

The second displacement member 16 permits, according to the position of the mark 20, a defined displacement at right angles to the displacement direction of the same by means of a U-shape slide 22 and an by operation of adjustment screw 23.

The slide 22 is displaceably mounted on a bottom plate 31. In FIG. 6 an enlarged view of the adjustment mark 20 is shown and a part of the reference mark 29.

The reference mark 29 is constituted of a straight line which is in parallel to the x-coordinate, and of division lines which, at right angles to the x-coordinate, are in parallel to the y-coordinate at a definite mutual space.

We claim:

1. A manipulation device for the precision adjustment of pattern-bearing substrates comprising
 a double microscope having adjustable optical axes,
 a plane pattern bearng substrate,
 two adjustment marks being arranged on said pattern bearing substrate at a definite distance,
 a housing having a top plate and a bottom plate,
  said top plate being for supporting said pattern bearing substrate,
 a reference mark being non-displaceably attached to the top plate of said manipulation device, said reference mark being substantially arranged in the plane defined by said two adjustment marks, and extending in the x-coordinate of an orthogonal xy-coordinate system and having division lines parallel to the y-direction,
 an intermediate plate being located in and secured to said housing, said top plate, said intermediate plate and said bottom plate being substantially in parallel to each other and to the plane defined by the xy-coordinate system,
 a first slide being displaceable on said intermediate plate,
 a vacuum holding means connected to said first slide, said holding means being for connecting said pattern bearing substrate to said first slide,
 a U-shaped second slide being seated for displacements in x-direction on said bottom plate and embracing said first slide,
 means for displacing said second slide according to the distance between said adjustment marks, first, a second and a third displacement member for displacing and rotating said pattern bearing substrate, acting upon said first slide, said first member being seated in said housing in parallel to the $x$-direction of said reference mark, and being for displacing the pattern bearing substrate in the $x$-direction, said second member being for displacing said pattern bearing substrate in the $y$-direction in parallel to said division lines of said reference mark, said second member being seated in said second slide, said third member effecting angular displacements of said pattern bearing substrate and being seated in said housing.

* * * * *